United States Patent
Dönitz et al.

(10) Patent No.: US 8,901,510 B2
(45) Date of Patent: Dec. 2, 2014

(54) PARTICLE BEAM DEVICE HAVING A DETECTOR ARRANGEMENT

(75) Inventors: Dietmar Dönitz, Aalen (DE); Christian Wagner, Aalen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 13/430,913

(22) Filed: Mar. 27, 2012

(65) Prior Publication Data

US 2012/0286159 A1 Nov. 15, 2012

(30) Foreign Application Priority Data

Mar. 31, 2011 (DE) .......................... 10 2011 006 588

(51) Int. Cl.
*G21K 1/08* (2006.01)
*H01J 37/28* (2006.01)

(52) U.S. Cl.
CPC ...................................... *H01J 37/28* (2013.01)
USPC ...................................... 250/396 R; 250/397

(58) Field of Classification Search
None
See application file for complete search history.

(56) References Cited

U.S. PATENT DOCUMENTS

| | | | | |
|---|---|---|---|---|
| 5,369,275 A | * | 11/1994 | Usui et al. ........................ | 850/9 |
| 6,049,586 A | * | 4/2000 | Kitaguchi et al. ............... | 378/57 |
| 6,825,468 B2 | * | 11/2004 | Oi et al. ......................... | 250/311 |
| 6,963,068 B2 | * | 11/2005 | Asselbergs et al. ............ | 250/311 |
| 8,269,194 B2 | * | 9/2012 | Kaito et al. ............... | 250/492.21 |
| 8,610,060 B2 | * | 12/2013 | Asai et al. ..................... | 250/311 |
| 2005/0035291 A1 | * | 2/2005 | Hill et al. ....................... | 250/309 |
| 2006/0006346 A1 | * | 1/2006 | Rathmell et al. ........... | 250/492.21 |
| 2006/0076489 A1 | * | 4/2006 | Ohshima et al. .............. | 250/310 |
| 2006/0231773 A1 | * | 10/2006 | Katagiri et al. ............. | 250/492.1 |
| 2007/0102650 A1 | * | 5/2007 | Katagiri et al. ............. | 250/492.3 |
| 2007/0221843 A1 | * | 9/2007 | Ward et al. ..................... | 250/309 |
| 2008/0035860 A1 | * | 2/2008 | Hill et al. .................... | 250/492.3 |

(Continued)

FOREIGN PATENT DOCUMENTS

| JP | 61088442 A | * | 5/1986 | .............. H01J 37/28 |
|---|---|---|---|---|
| JP | 2012048819 A | * | 3/2012 | |

OTHER PUBLICATIONS

Stefan Zaefferer and Stuart I. Wright, "Chapter 8: Three-Dimensional Orientation Microscopy by Serial Sectioning and EBSD-Based Orientation Mapping in a FIB-SEM," from *Electron Backscatter Diffraction in Materials Science*, A. J. Schwartz et al. (eds.), Springer, 2009, pp. 109-122.

(Continued)

*Primary Examiner* — Andrew Smyth
(74) *Attorney, Agent, or Firm* — Muirhead and Saturnelli, LLC

(57) ABSTRACT

A particle beam device has a first column with a first beam axis, the first column having a first particle beam generator and a first objective lens for focusing the first particle beam on an object. A second column with a second beam axis is provided, the second column having a second particle beam generator and a second objective lens for focusing the second particle beam on the object. A detector, having a detection axis, detects interacting particles and/or radiation. The first beam axis and the second beam axis define a first angle, different from 0° and from 180°. The first and second beam axes are situated in a first plane. The detection axis of the detector and the first beam axis are situated in a second plane. The first plane and the second plane define a second angle having an absolute value in the range of 65° to 80°.

17 Claims, 2 Drawing Sheets

(56) References Cited

U.S. PATENT DOCUMENTS

| | | | |
|---|---|---|---|
| 2008/0067440 A1* | 3/2008 | Cox | 250/492.21 |
| 2008/0296498 A1* | 12/2008 | Hong | 250/311 |
| 2009/0114840 A1* | 5/2009 | Ward et al. | 250/423 F |
| 2009/0173888 A1* | 7/2009 | Shichi et al. | 250/397 |
| 2009/0179161 A1* | 7/2009 | Ward et al. | 250/492.21 |
| 2009/0230299 A1* | 9/2009 | Shichi et al. | 250/282 |
| 2010/0019150 A1* | 1/2010 | Nishiyama et al. | 250/310 |
| 2010/0025578 A1* | 2/2010 | Hill et al. | 250/307 |
| 2010/0084553 A1* | 4/2010 | Frosien | 250/307 |
| 2010/0176296 A1* | 7/2010 | Kaito et al. | 250/307 |
| 2011/0215242 A1* | 9/2011 | Preikszas | 250/307 |
| 2011/0291007 A1* | 12/2011 | Wang et al. | 250/307 |
| 2011/0297827 A1* | 12/2011 | Asai et al. | 250/310 |

OTHER PUBLICATIONS

Carl Zeiss, "AURIGA Series Information beyond Resolution: CrossBeam Workstations (FIB-SEM) from Carl Zeiss," Brochure, published at Oberkochen, Germany, Nov. 8, 2011, 11 pp., plus excerpt (1 page).

Carl Zeiss, "Instruction Manual Auriga Series: Modular CrossBeam Workstation," published at Oberkochen, Germany, 2004, p. 39 (excerpt).

* cited by examiner

PARTICLE BEAM DEVICE HAVING A DETECTOR ARRANGEMENT

TECHNICAL FIELD

This application relates to a particle beam device having a detector arrangement.

BACKGROUND OF THE INVENTION

Particle beam devices, for example electron beam devices, have been used for quite some time for examining objects (samples). Scanning electron microscopes (also referred to below as SEM) in particular are known.

An SEM has an electron beam column in which a beam generator and an objective lens are situated. With the aid of the beam generator, an electron beam is generated which is focused by the objective lens on an object to be examined. With the aid of a deflection device, the electron beam (also referred to below as a primary electron beam) is guided in a raster-like manner over the surface of the object to be examined. In the process, the electrons of the primary electron beam interact with the object. As a result of the interaction, in particular electrons are emitted from the object (so-called secondary electrons), or electrons of the primary electron beam are backscattered (so-called backscattered electrons). Secondary electrons and backscattered electrons form the so-called secondary beam, and are detected using a detector. The detector signal thus generated is used for image generation, for example.

Furthermore, it is known to additionally equip an SEM with an ion column (also referred to below as a combination device). With the aid of an ion beam generator situated in the ion column, ions are generated which are used for preparing objects (for example, ablating material from an object or applying material to an object), or also for imaging.

The previously described combination device is used, for example, for analyzing a crystal structure of an object. For this purpose, it is known from the prior art to determine the distribution of electrons which are backscattered at the object after incidence of a primary electron beam on the object. The above method is known as electron backscattering diffraction (EBSD). For example, to prepare for the method, a layer of a surface of an object to be analyzed is initially ablated with the aid of the ion beam. The primary electron beam is subsequently focused on an exposed layer of the surface of the object. Electrons are backscattered from the surface of the object due to the interaction of the electrons of the primary electron beam with the material of the object. The distribution of the backscattered electrons is determined in order to draw conclusions concerning the crystal structure of the object. Thus, information is basically obtained concerning the crystal structure with regard to this surface (i.e., in two dimensions).

To obtain information concerning the crystal structure in three dimensions, the exposed layer of the surface of the object to be analyzed is subsequently ablated, and then the primary electron beam is once again focused on an exposed layer of the surface of the object to be analyzed. Thus, an ablation of a layer of the object to be analyzed and an examination of a layer of the object to be analyzed which is exposed during the ablation are essentially carried out in alternation. By combining the information concerning the crystal structure of the individual surfaces, information concerning the crystal structure is then obtained in three dimensions (also referred to as 3D EBSD).

To determine the distribution of the backscattered electrons, a two-dimensional detector having a scintillator and a CCD camera, for example, is used.

For ablating the layer, it is known from the prior art to move the object to be analyzed into a first position, and for examining the exposed layer, to move the object to be analyzed into a second position. The motion occurs, for example, with the aid of an object holder on which the object to be analyzed is situated. The object holder has a design which, for example, is linearly movable in three mutually perpendicular directions. In addition, the object holder may, for example, be rotated about a first rotational axis and about a second rotational axis which is oriented perpendicularly to the first rotational axis. However, it is disadvantageous that each motion and/or rotation of the object holder is associated with an error due to mechanical factors. In other words, it is very likely that when a desired position of the object to be analyzed is adjusted, the object to be analyzed does not occupy this exact desired position. This results in errors in measuring the crystal structure of the object to be analyzed or requires time-consuming readjustment of the object holder.

To solve the above-described problem, a combination device is known from the prior art which is provided with a detector arrangement in such a way that the object no longer has to be moved in order to ablate a layer or to examine a layer. This known combination device has a first particle beam column, the first particle beam column having a first beam generator for generating a first particle beam, and a first objective lens for focusing the first particle beam on an object. The first particle beam column has a first beam axis. In addition, the combination device is provided with a second particle beam column, the second particle beam column having a second beam generator for generating a second particle beam, and a second objective lens for focusing the second particle beam on the object. In addition, the second particle beam column has a second beam axis. The first beam axis of the first particle beam column and the second beam axis of the second particle beam column define a first angle of approximately 50° to approximately 60°. In addition, the first beam axis of the first particle beam column and the second beam axis of the second particle beam column are situated in a first plane. Furthermore, the combination device is provided with a detector for detecting electrons which are backscattered from the object and which are used for carrying out the EBSD method. A detection axis which is situated in a second plane extends from the detector to the object. The first beam axis is likewise situated in the second plane. The first plane and the second plane define a second angle which is exactly 90°.

However, it has been shown that the measuring results which are obtained from the EBSD method carried out using the above-mentioned combination device are not satisfactory enough to identify the crystal structure of an object to be analyzed with acceptable quality. In addition, it has turned out that processing an object with the aid of a particle beam does not provide sufficiently good results. Furthermore, for the known combination device it is not possible to process the object with the aid of a first particle beam and simultaneously carry out the above-described EBSD method with the aid of a second particle beam.

Accordingly, it would be desirable to provide a particle beam device using which a method may be carried out so that in particular crystal structures of objects to be analyzed are satisfactorily identified. In addition, it should not be absolutely necessary to move an object between a processing position and an analyzing position in which the EBSD method is carried out. Furthermore, it is desirable for an object to be processable with the aid of a particle beam with grazing incidence of the particle beam on the object. The phrase "with grazing incidence" is understood to mean that the angle between the particle beam axis and the surface to be processed is small, for example, less than 4°.

SUMMARY OF THE INVENTION

According to the system described herein, a particle beam device is provided with at least one first particle beam column and at least one second particle beam column. The first particle beam column may have at least one first beam generator for generating a first particle beam, and at least one first objective lens for focusing the first particle beam on an object. In addition, the first particle beam column may have a first beam axis. The second particle beam column may have at least one second beam generator for generating a second particle beam, and at least one second objective lens for focusing the second particle beam on the object. In addition, the second particle beam column may have a second beam axis.

Furthermore, the particle beam device according to the system described herein may be provided with at least one detector for detecting interacting particles and/or interacting radiation. A detection axis extends from the detector to the object.

The interacting particles and/or interacting radiation result(s), for example, from incidence of the first particle beam on a surface of the object to be analyzed. The surface may have been previously exposed with the aid of the second particle beam, for example. For example, the detector may be provided for detecting particles which are backscattered at the object (backscattered electrons, for example) and/or particles which are emitted by the object (secondary electrons, for example).

The first beam axis of the first particle beam column and the second beam axis of the second particle beam column may define a first angle which is different from 0° and from 180°. Accordingly, the first particle beam column and the second particle beam column may be oriented at an angle relative to one another, not in parallel to one another. In addition, the first beam axis of the first particle beam column and the second beam axis of the second particle beam column may be situated in a first plane. On the other hand, the detection axis of the detector may be situated in a second plane, the second plane being defined by the detection axis and the first beam axis. Therefore, the first beam axis may likewise be situated in the second plane. The first plane and the second plane may define a second angle having an absolute value in the range of 65° to 80°.

Thus, in contrast to the prior art described above, the system described herein does not provide that the first plane and the second plane are perpendicular to one another, but, rather, that the two planes define the second angle. Surprisingly, it has been shown that when the second angle is selected in the above-mentioned range, it is possible at the same time to process the object with grazing incidence with the aid of the second particle beam, and with the aid of the first particle beam to carry out an EBSD method in such a way that crystal structures of the object are satisfactorily identified. The second angle may be selected depending on the first angle, as discussed in greater detail below.

With the aid of the particle beam device according to the system described herein, a method may be carried out in which the object to be analyzed no longer has to be moved in order to ablate a layer or to examine a layer. Nevertheless, it may be provided that the object to be analyzed is situated on a movable object holder, the object holder not being moved for carrying out the method. An object holder which has a linearly movable design in three mutually perpendicular directions is an example of a suitable object holder. In addition, the object holder may be rotated, for example, about a first rotational axis and about a second rotational axis which is oriented perpendicularly to the first rotational axis.

The first beam axis of the first particle beam column and the second beam axis of the second particle beam column may intersect at a point which is referred to as the intersection point. In an embodiment of the particle beam device according to the system described herein, it is alternatively or additionally provided that the detection axis may pass through the intersection point. The object to be analyzed may be situated in such a way that the intersection point is located on a surface of the object to be analyzed which, for example, has been exposed with the aid of the second particle beam and is analyzed with the aid of the first particle beam.

Furthermore, it is alternatively or additionally provided that the particle beam device according to the system described herein may have a third plane. This third plane may be defined in such a way that it is oriented perpendicularly to the second plane, and in such a way that the detection axis may be situated in the third plane. In another embodiment it is provided that the third plane may be oriented perpendicularly to the first plane. In turn it is provided, for example, that the third plane may be a horizontal plane. However, deviations from the horizontal plane in the range of ±10°, ±15°, or ±20° are possible.

In yet another embodiment of the particle beam device according to the system described herein, it is alternatively or additionally provided that the particle beam device may have one of the following features:

the absolute value of the first angle is in the range of 40° to 80°;

the absolute value of the first angle is in the range of 45° to 70°;

the absolute value of the first angle is in the range of 50° to 60°; or the absolute value of the first angle is in the range of 52° to 55°.

For example, the first angle is 54°. The second angle may be selected, for example, depending on the first angle.

As mentioned above, the absolute value of the second angle is in the range of 65° to 80°. In an embodiment of the particle beam device according to the system described herein, it is alternatively or additionally provided that the particle beam device may have one of the following features:

the absolute value of the second angle is in the range of 70° to 80°; or the absolute value of the second angle is in the range of 73° to 78°.

For example, the second angle may be 74.7°. Another exemplary embodiment of the particle beam device according to the system described herein alternatively or additionally provides that the first beam axis of the first particle beam column and a surface normal of a surface of an object to be examined may define a third angle having an absolute value in the range of 30° to 90°. For example, it is provided that the particle beam device may have one of the following features:

the absolute value of the third angle is in the range of 40° to 80°;

the absolute value of the third angle is in the range of 65° to 75°; or the absolute value of the third angle is 70°.

It has been shown that when the third angle is selected in the above-mentioned ranges or selected to have the above-mentioned value, good measurement of a crystal structure of an object is possible.

In yet another embodiment of the particle beam device according to the system described herein, it is alternatively or additionally provided that the second beam axis of the second particle beam column may be oriented in such a way that the second beam axis of the second particle beam column and a surface to be processed of an object to be analyzed define a fourth angle having an absolute value in the range of 0° to 11°. For example, it is provided that the particle beam device according to the system described herein may have one of the following features:

the absolute value of the fourth angle is in the range of 0° to 5°; or the absolute value of the fourth angle is in the range of 0° to 2°.

For example, the fourth angle may be 0°. This is also referred to as a grazing incidence of the second particle beam on a surface of an object to be analyzed.

Studies have shown that good measurements of crystal structures of an object are obtained when the following conditions are met:

$$\cos\alpha = \frac{1}{\tan\varphi \cdot \tan\gamma} - \frac{\sin\beta}{\sin\varphi \cdot \sin\gamma},$$ [Equation 1]

and $$\sin\beta = (-\sin\varphi \cdot \sin\gamma \cdot \cos\alpha + \cos\varphi \cdot \cos\gamma)$$ [Equation 2], where φ corresponds to the first angle, α corresponds to the second angle, γ corresponds to the third angle, and β corresponds to the fourth angle. Equation 2 corresponds to Equation 1 after conversion.

In yet another embodiment of the particle beam device according to the system described herein, it is additionally or alternatively provided that an object is situatable in the particle beam device in such a way that a surface to be examined may be oriented in the direction of the detector. In other words, in this embodiment a surface normal of the surface of the object may be situated in the second plane.

Furthermore, in an embodiment of the particle beam device according to the system described herein it is provided that the particle beam device may have one of the following features:

the first particle beam column is designed as an electron beam column, and the second particle beam column is designed as an ion beam column;

the first particle beam column is designed as an ion beam column, and the second particle beam column is designed as an electron beam column; or the first particle beam column as well as the second particle beam column are designed either as an electron beam column or as an ion beam column.

BRIEF DESCRIPTION OF THE DRAWINGS

Embodiments of the system described herein are explained in greater detail below with reference to the figures, which are briefly described as follows.

DETAILED DESCRIPTION OF VARIOUS EMBODIMENTS

Figure 1:
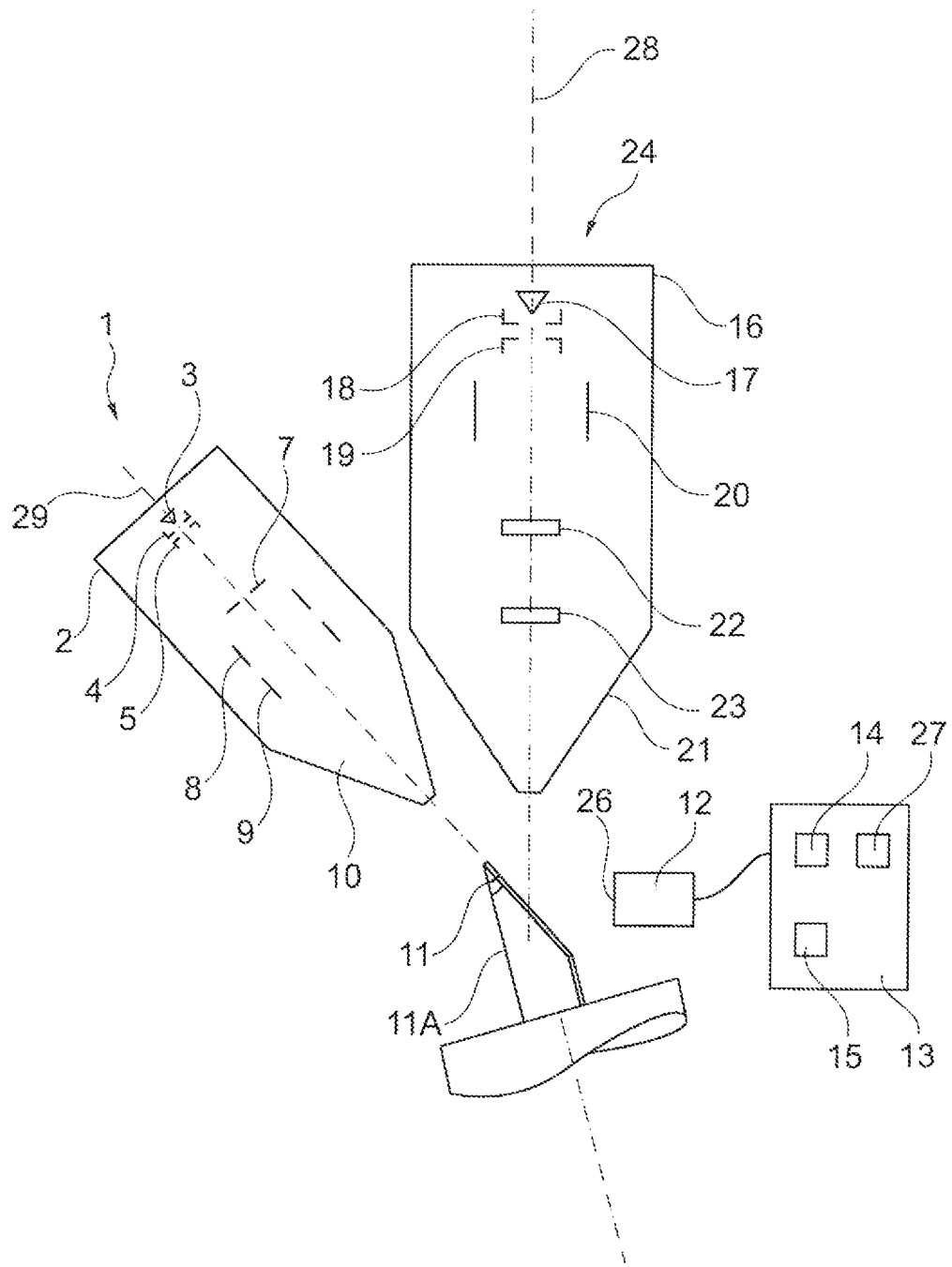
FIG. 1 shows a schematic view of a particle beam device according to an embodiment of the system described herein.

FIG. 1 shows a schematic view of a particle beam device which has an ion beam device 1 and an electron beam device 24 according to an embodiment of the system described herein.

The ion beam device 1 has an ion beam column 2 in which numerous units of the ion beam device 1 are arranged. In particular, an ion source 3 is situated in the ion beam column 2. The ion source 3 generates ions, which form an ion beam in the ion beam column 2. The ion source 3 may be used to generate a certain type of ion, for example gallium ions. However, the system described herein is not limited to this type of ion. Rather, any suitable type of ion may be used.

The ions are accelerated to a predefinable potential with the aid of an ion beam electrode 4, and are subsequently guided through a first condenser lens 5. The ion beam formed from the ions is guided through an aperture 7, and then passes to a first electrode system 8 and to a second electrode system 9 which are designed as scanning electrodes. The ion beam composed of the ions is scanned in a raster pattern over an object 11 to be examined with the aid of the first electrode system 8 and the second electrode system 9. The object 11 is situated on an object holder 11A. The ion beam has previously been directed onto the object 11 with the aid of a first objective lens 10. With the aid of the ion beam which has been directed onto the object 11, the surface of the object 11 is prepared, in particular material is ablated, to allow an examination using an EBSD method. This is explained in greater detail below.

In an embodiment, the electron beam device 24 is designed as a scanning electron microscope. The electron beam device has an electron column 16 in which the units of the electron beam device 24 are arranged. Thus, an electron source 17 is provided which generates electrons that are extracted with the aid of a first electrode 18. The electrons are accelerated to a predefinable potential with the aid of a second electrode 19. The electrons are subsequently guided through a second condenser lens 20, thus forming an electron beam. The electron beam is focused on the object 11 to be analyzed with the aid of a second objective lens 21. Scanning electrodes or scanning coils (not illustrated) situated at the second objective lens 21 ensure that it is possible to scan the electron beam over the object 11. When the electron beam strikes the object 11, interacting particles, in particular secondary electrons and backscattered electrons, result. These interacting particles are detected with the aid of a first detector 22 and a second detector 23, and are used for imaging. It is thus possible to generate an image of the surface of the object 11.

The particle beam device also has a location-sensitive detector 12 which, for example, has a scintillator having a location-sensitive scintillation surface 26, and a CCD camera. However, it is pointed out that the system described herein is not limited to a detector having a scintillator and/or a CCD camera. Rather, any suitable detector is usable for the system described herein. The configuration of detector 12 is schematically illustrated in FIG. 1. The exact configuration is explained in greater detail below. The location-sensitive scintillation surface 26 may be provided with a protective layer, or the scintillator may have an exchangeable design in order to replace the protective layer or the scintillator when the location-sensitive scintillation surface 26 is damaged by incident particles.

Detector 12 is used to carry out the EBSD method, and detects electrons which are backscattered from the surface of the object 11 when the electron beam strikes the object 11. The spatial distribution of the electrons which are backscattered from the surface of the object 11 may be determined with the aid of the location-sensitive scintillation surface 26. For this purpose, the detector 12 is connected to a control unit 13, which has a processor 15. The processor 15 determines the spatial distribution and delivers appropriate signals to a display device 27, with the aid of which the spatial distribution of the scattered electrons is visualized. The spatial distribution of crystallites of the object 11 as well as the size and configuration of the crystallites of the object 11 are determined in this way. The determined data may be stored in a memory unit 14.

Figure 2:
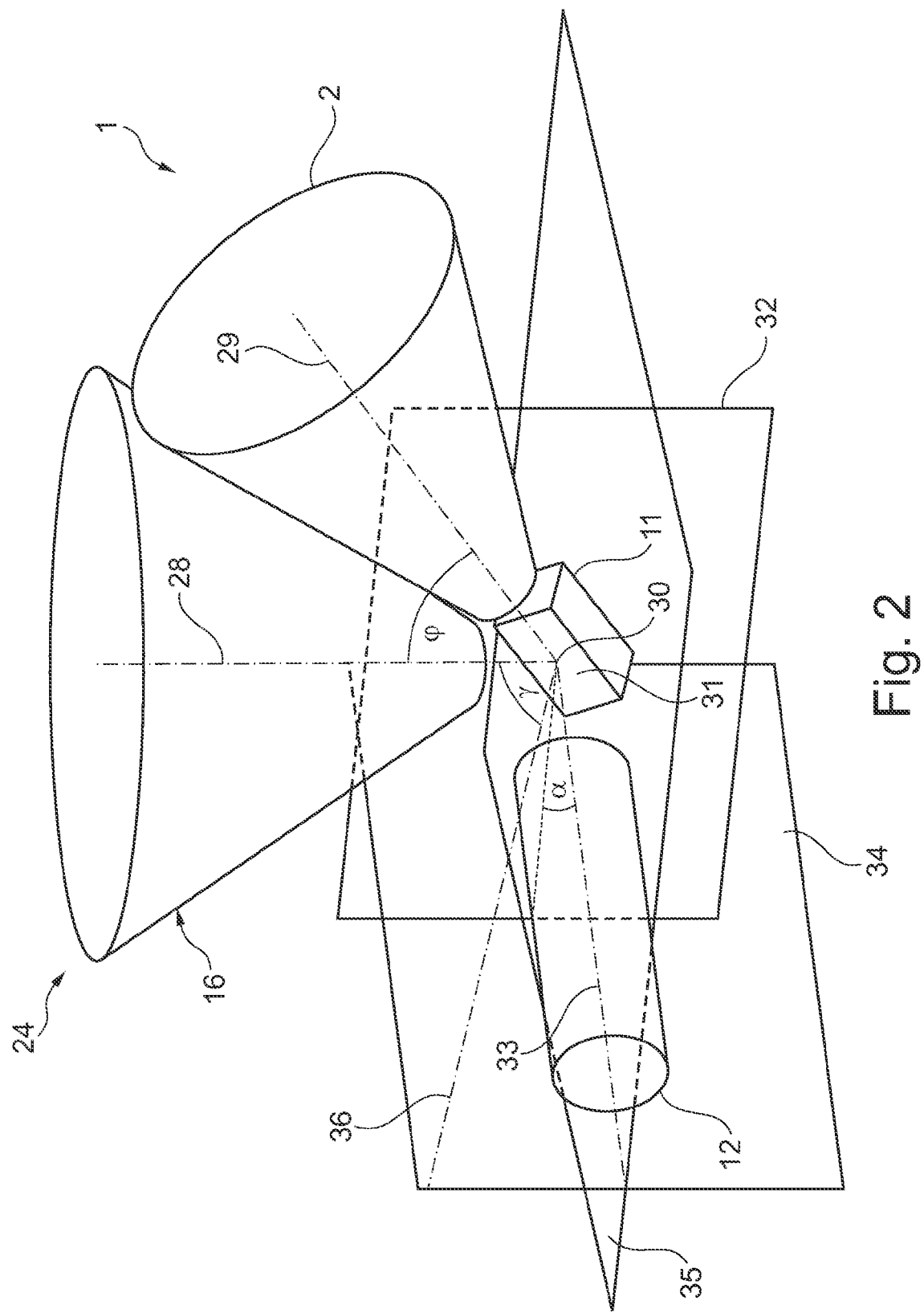
FIG. 2 shows another schematic view of the particle beam device according to FIG. 1.

FIG. 2 shows another schematic view of the particle beam device according to FIG. 1. Identical components are provided with the same reference numerals. The electron beam column 16 has a first beam axis 28. The ion beam column 2, on the other hand, has a second beam axis 29. The first beam axis 28 and the second beam axis 29 meet at an intersection point 30, at which a surface 31 of the object 11 to be examined may be positioned. The first beam axis 28 and the second beam axis 29 are situated relative to one another in such a way that they define a first angle $\phi$. Thus, the electron beam column 16 and the ion beam column 2 are inclined to one another. The absolute value of the first angle $\phi$ is, for example, in the range of 40° to 80°, or in the range of 45° to 70°, or in the range of 50° to 60°, or in the range of 52° to 55°. In addition, the first beam axis 28 and the second beam axis 29 are situated in a first plane 32.

The detector 12 has a detection axis 33 which likewise extends to the intersection point 30 on the surface 31 of the object 11. The detection axis 33 is situated in a second plane 34. In addition, the first beam axis 28 is situated in the second plane 34. The first plane 32 and the second plane 34 define a second angle $\alpha$ having an absolute value in the range of 65° to 80°. For example, the absolute value of the second angle $\alpha$ is in the range of 70° to 80° or in the range of 73° to 78°. Furthermore, a third plane 35 is provided. This third plane 35 is defined in such a way that it is oriented perpendicularly to the second plane 34, and in such a way that the detection axis 33 is situated in the third plane 35. For example, the third plane 35 is oriented perpendicularly to the first plane 32 and also perpendicularly to the second plane 34, it not being absolutely necessary for the third plane 35 to be perpendicular to the first plane 32. The third plane 35 is a horizontal plane, for example. However, deviations from the horizontal plane in the range of ±10°, ±15°, or ±20° are possible.

In the exemplary embodiment illustrated here, the detector 12 is designed to be movable along the detection axis 33. On the one hand, this allows a variable distance adjustment of the location-sensitive scintillation surface 26 with respect to the object 11. On the other hand, this allows the detector 12 to be retracted to a wall of a sample chamber (not illustrated), so that the detector 12 does not interfere with further measurements. The motion of the detector 12 may be motorized, for example, and may occur automatically. It is pointed out that the system described herein is not limited to a motion of the detector 12 along the detection axis 33. Rather, the motion may occur along an axis which defines an angle, for example 5° to 30°, relative to the detection axis 33.

For the examination using the EBSD method, the object 11 is aligned in the particle beam device in such a way that the first beam axis 28 of the electron beam column 24 and a surface normal 36 of the surface 31 of the object 11 define a third angle $\gamma$ having an absolute value in the range of 30° to 90°. For example, the absolute value of the third angle $\gamma$ is in the range of 40° to 80°, or in the range of 65° to 75°. In the exemplary embodiment illustrated here, the absolute value of the third angle $\gamma$ is 70°. The third angle $\gamma$ is achieved, for example, in that the object holder 11A has a holding surface for the object 11, the surface normal of the holding surface and the first beam axis 28 defining the third angle $\gamma$.

In addition, for the examination using the EBSD method, the object 11 and the second beam axis 29 of the ion beam column 2 are oriented relative to one another in such a way that the second beam axis 29 and the surface 31 of the object 11 define a fourth angle $\beta$ having an absolute value in the range of 0° to 11°. For example, the absolute value of the fourth angle $\beta$ is in the range of 0° to 5°, or in the range of 0° to 2°. In the exemplary embodiment illustrated here, the fourth angle $\beta$ is 0°. This is also referred to as a grazing incidence of the ion beam on the surface 31 of the object 11.

The object 11 is examined in greater detail using the EBSD method with the aid of the above-described particle beam device. In preparation for this purpose, the ion beam is focused on the object 11 and scanned in a raster pattern over the surface 31 of the object 11. The surface 31 of the object 11 is prepared by material ablation. As previously described, the preparation (material ablation) is observable with the aid of the electron beam. In the process, the electron beam is scanned in a raster pattern over the surface 31 of the object 11. Secondary electrons and/or backscattered electrons are detected with the aid of the first detector 22 and/or the second detector 23, for example. A detection signal thus generated is then used for generating an image of the surface 31 of the object 11.

After the object 11 is prepared, the electron beam is focused on the prepared surface 31 of the object 11, resulting in interactions of the electrons of the electron beam with the material of the object 11. In the process, electrons are backscattered from the object 11. These backscattered electrons are detected with the aid of the detector 12. The spatial distribution of the backscattered electrons is subsequently determined. This is carried out with the aid of the above-mentioned control unit 13. The spatial distribution of the detected electrons may be displayed on the display device 27.

Alternatively, it is provided that the object 11 is prepared with the aid of the ion beam, and that EBSD examinations are carried out simultaneously with the aid of the electron beam as well as the detector 12.

The above-described method may be carried out numerous times in succession. For example, another plane of the object 11 is exposed with the aid of the ion beam, and is subsequently measured using the EBSD method. Based on the individual two-dimensional representations of the individual planes, a three-dimensional representation of the object 11 may then be computed. With the aid of the described method, it is possible to determine and represent in three dimensions the spatial distribution of all crystallites of the object 11 as well as the spatial orientation of all crystallites of the object 11. In order to prepare the individual planes of the object 11, it may be provided that the positioning of the second beam axis 29 is slightly changed (for example, up to several 10 µm). This ensures that grazing incidence of the second particle beam occurs on the surface of the object 11.

With the aid of the particle beam device according to the system described herein, a method may be carried out in which the object 11 to be analyzed no longer has to be moved in order to ablate a layer or to examine a layer. Surprisingly, it has been shown that when second angle $\alpha$ is selected in the above-mentioned range, a measurement using the EBSD method is possible in such a way that crystal structures of the object 11 are satisfactorily identified. The second angle α may be selected depending on the first angle φ, the third angle γ, and the fourth angle β. Studies have shown that good measurements of crystal structures of the object 11 are obtained when the following conditions are met:

$$\cos\alpha = \frac{1}{\tan\varphi \cdot \tan\gamma} - \frac{\sin\beta}{\sin\varphi \cdot \sin\gamma},$$ [Equation 1]

and $$\sin\beta = (-\sin\varphi \cdot \sin\gamma \cdot \cos\alpha + \cos\varphi \cdot \cos\gamma)$$ [Equation 2], where Equation 2 corresponds to Equation 1 after conversion. It is further pointed out that the range limits of the ranges mentioned above are always contained within these ranges.

Various embodiments discussed herein may be combined with each other in appropriate combinations in connection with the system described herein. Additionally, in some instances, the order of steps in the flowcharts, flow diagrams and/or described flow processing may be modified, where appropriate. Further, various aspects of the system described herein may be implemented using software, hardware, a combination of software and hardware and/or other computer-implemented modules or devices having the described features and performing the described functions. Software implementations of the system described herein may include executable code that is stored in a computer readable medium and executed by one or more processors. The computer readable medium may include a computer hard drive, ROM, RAM, flash memory, portable computer storage media such as a CD-ROM, a DVD-ROM, a flash drive and/or other drive with, for example, a universal serial bus (USB) interface, and/or any other appropriate tangible or non-transitory computer readable medium or computer memory on which executable code may be stored and executed by a processor. The system described herein may be used in connection with any appropriate operating system.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A particle beam device, comprising:
    at least one first particle beam column, wherein the first particle beam column includes at least one first beam generator for generating a first particle beam and at least one first objective lens for focusing the first particle beam on an object, the first particle beam column having a first beam axis;
    at least one second particle beam column, wherein the second particle beam column includes at least one second beam generator for generating a second particle beam and at least one second objective lens for focusing the second particle beam on the object, the second particle beam column having a second beam axis; and
    at least one detector for detecting interacting particles or interacting radiation, a detection axis extending from the detector to the object,
    wherein the first beam axis of the first particle beam column and the second beam axis of the second particle beam column are situated in a first plane,
    wherein the first beam axis of the first particle beam column and the second beam axis of the second particle beam column define a first angle which is different from 0° and from 180°,
    wherein the detection axis of the detector and the first beam axis are situated in a second plane, and
    wherein the first plane and the second plane define a second angle having an absolute value in the range of 65° to 80°.

2. The particle beam device according to claim 1, wherein the first beam axis of the first particle beam column and the second beam axis of the second particle beam column intersect at an intersection point, and wherein the detection axis passes through the intersection point.

3. The particle beam device according to claim 1, wherein the particle beam device has a third plane which is oriented perpendicularly to the second plane, and wherein the detection axis is situated in the third plane.

4. The particle beam device according to claim 3, wherein the third plane is oriented perpendicularly to the first plane.

5. The particle beam device according to claim 3, wherein the third plane is a horizontal plane.

6. The particle beam device according to claim 1, further comprising one of the following features:
    (i) the absolute value of the first angle is in the range of 40° to 80°;
    (ii) the absolute value of the first angle is in the range of 45° to 70°;
    (iii) the absolute value of the first angle is in the range of 50° to 60°; or
    (iv) the absolute value of the first angle is in the range of 52° to 55°.

7. The particle beam device according to claim 1, further comprising one of the following features:
    (i) the absolute value of the second angle is in the range of 70° to 80°; or
    (ii) the absolute value of the second angle is in the range of 73° to 78°.

8. The particle beam device according to claim 1, wherein the first beam axis of the first particle beam column and a surface normal of a sample surface of the object to be examined define a third angle having an absolute value in the range of 30° to 90°.

9. The particle beam device according to claim 8, further comprising one of the following features:
    (i) the absolute value of the third angle is in the range of 40° to 80°;
    (ii) the absolute value of the third angle is in the range of 65° to 75°; or
    (iii) the absolute value of the third angle is 70°.

10. The particle beam device according to claim 1, wherein the second beam axis of the second particle beam column is oriented in such a way that the second beam axis of the second particle beam column and a surface of the object to be processed define a fourth angle having an absolute value in the range of 0° to 11°.

11. The particle beam device according to claim 10, further comprising one of the following features:
    (i) the absolute value of the fourth angle is in the range of 0° to 5°; or
    (ii) the absolute value of the fourth angle is in the range of 0° to 2°.

12. The particle beam device according to claim 1, wherein the object is situatable in the particle beam device in such a way that a surface of the object to be examined is oriented in the direction of the detector.

13. The particle beam device according to claim 1, further comprising one of the following features:

(i) the first particle beam column is an electron beam column, and the second particle beam column is an ion beam column;
(ii) the first particle beam column is an ion beam column, and the second particle beam column is an electron beam column; or
(iii) the first particle beam column and the second particle beam column are both either an electron beam column or an ion beam column.

14. A particle beam device, comprising:
at least one first particle beam column, wherein the first particle beam column includes at least one first beam generator for generating a first particle beam and at least one first objective lens for focusing the first particle beam on an object, the first particle beam column having a first beam axis, and wherein the first particle beam column is an electron beam column used for monitoring or examining;
at least one second particle beam column, wherein the second particle beam column includes at least one second beam generator for generating a second particle beam and at least one second objective lens for focusing the second particle beam on the object, the second particle beam column having a second beam axis, and wherein the second particle beam column is an ion beam column used for processing the object, and wherein an ion beam of the ion beam column is provided with a grazing incidence to a surface of the object; and
at least one detector for detecting interacting particles or interacting radiation, a detection axis extending from the detector to the object,
wherein the first beam axis of the first particle beam column and the second beam axis of the second particle beam column are situated in a first plane,
wherein the first beam axis of the first particle beam column and the second beam axis of the second particle beam column define a first angle which is different from 0° and from 180°,
wherein the detection axis of the detector and the first beam axis are situated in a second plane, and
wherein the first plane and the second plane define a second angle having an absolute value in the range of 65° to 80°.

15. A particle beam device, comprising:
at least one first particle beam column, wherein the first particle beam column includes at least one first beam generator for generating a first particle beam and at least one first objective lens for focusing the first particle beam on an object, the first particle beam column having a first beam axis;
at least one second particle beam column, wherein the second particle beam column includes at least one second beam generator for generating a second particle beam and at least one second objective lens for focusing the second particle beam on the object, the second particle beam column having a second beam axis; and
at least one detector for detecting interacting particles or interacting radiation, a detection axis extending from the detector to the object,
wherein the first beam axis of the first particle beam column and the second beam axis of the second particle beam column are situated in a first plane,
wherein the first beam axis of the first particle beam column and the second beam axis of the second particle beam column define a first angle which is different from 0° and from 180°,
wherein the detection axis of the detector and the first beam axis are situated in a second plane,
wherein the first plane and the second plane define a second angle having an absolute value in the range of 65° to 80°, and
wherein the particle beam device is configured to determine information about a crystal structure of the object.

16. The particle beam device according to claim 15, wherein the information about the crystal structure of the object is determined without moving the object between a processing step in which a layer of the object is ablated and a step in which the crystal structure of the object is identified.

17. A method of using a particle beam device, comprising:
generating a first particle beam using at least one first beam generator of at least one first particle beam column;
focusing the first particle beam on an object using at least one first objective lens, the first particle beam column having a first beam axis;
generating a second particle beam using at least one second beam generator of at least one second particle beam column,
focusing the second particle beam on the object using at least one second objective lens, the second particle beam column having a second beam axis, wherein the second particle beam is provided with a grazing incidence to a surface of the object, and wherein the object is not moved for ablating or examining a layer of the object; and
detecting interacting particles or interacting radiation using at least one detector, a detection axis extending from the detector to the object; and
wherein the first beam axis of the first particle beam column and the second beam axis of the second particle beam column are situated in a first plane,
wherein the first beam axis of the first particle beam column and the second beam axis of the second particle beam column define a first angle which is different from 0° and from 180°,
wherein the detection axis of the detector and the first beam axis are situated in a second plane, and
wherein the first plane and the second plane define a second angle having an absolute value in the range of 65° to 80°.

* * * * *

UNITED STATES PATENT AND TRADEMARK OFFICE
CERTIFICATE OF CORRECTION

PATENT NO. : 8,901,510 B2
APPLICATION NO. : 13/430913
DATED : March 27, 2012
INVENTOR(S) : Dietmar Dönitz et al.

It is certified that error appears in the above-identified patent and that said Letters Patent is hereby corrected as shown below:

Specification,

Column 5, line 22:

Studies have shown that good measurements of crystal structures of an object are obtained when the following conditions are met:

$$\cos \alpha = \frac{1}{\tan \varphi \cdot \tan \gamma} - \frac{\sin \beta}{\sin \varphi \cdot \sin \gamma} \quad \text{[Equation 1]},$$

and $$\sin \beta = (-\sin \varphi \cdot \sin \gamma \cdot \cos \alpha + \cos \varphi \cdot \cos \gamma) \quad \text{[Equation 2]},$$

where [[ϕ]] $\underline{\varphi}$ corresponds to the first angle, α corresponds to the second angle, γ corresponds to the third angle, and β corresponds to the fourth angle. Equation 2 corresponds to Equation 1 after conversion.

Column 7, line 16:

Figure 2 shows another schematic view of the particle beam device according to Figure 1. Identical components are provided with the same reference numerals. The electron beam column 16 has a first beam axis 28. The ion beam column 2, on the other hand, has a second beam axis 29. The first beam axis 28 and the second beam axis 29 meet at an intersection point 30, at which a surface 31 of the object 11 to be examined may be positioned. The first beam axis 28 and the second beam axis 29 are situated relative to one another in such a way that they define a first angle [[ϕ]] $\underline{\varphi}$. Thus, the electron beam column 16 and the ion beam column 2 are inclined to one another. The absolute value Signed and Sealed this
Sixteenth Day of June, 2015

Michelle K. Lee
*Director of the United States Patent and Trademark Office* of the first angle [[ɸ]] φ is, for example, in the range of 40° to 80°, or in the range of 45° to 70°, or in the range of 50° to 60°, or in the range of 52° to 55°. In addition, the first beam axis 28 and the second beam axis 29 are situated in a first plane 32.

Column 8, line 61:

With the aid of the particle beam device according to the system described herein, a method may be carried out in which the object 11 to be analyzed no longer has to be moved in order to ablate a layer or to examine a layer. Surprisingly, it has been shown that when second angle α is selected in the above-mentioned range, a measurement using the EBSD method is possible in such a way that crystal structures of the object 11 are satisfactorily identified. The second angle α may be selected depending on the first angle [[ɸ]] φ, the third angle γ, and the fourth angle β. Studies have shown that good measurements of crystal structures of the object 11 are obtained when the following conditions are met:

$$\cos\alpha = \frac{1}{\tan\varphi \cdot \tan\gamma} - \frac{\sin\beta}{\sin\varphi \cdot \sin\gamma} \qquad \text{[Equation 1]},$$

and $$\sin\beta = (-\sin\varphi \cdot \sin\gamma \cdot \cos\alpha + \cos\varphi \cdot \cos\gamma) \qquad \text{[Equation 2]},$$

where Equation 2 corresponds to Equation 1 after conversion.
It is further pointed out that the range limits of the ranges mentioned above are always contained within these ranges.